United States Patent
Lin (10) Patent No.: US 9,895,778 B2
(45) Date of Patent: Feb. 20, 2018

(54) HEAT DISSIPATION UNIT MANUFACTURING METHOD

(71) Applicant: ASIA VITAL COMPONENTS CO., LTD., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 231 days.

(21) Appl. No.: 14/952,923

(22) Filed: Nov. 26, 2015

(65) Prior Publication Data
US 2017/0151641 A1    Jun. 1, 2017

(51) Int. Cl.
*B23P 15/26* (2006.01)

(52) U.S. Cl.
CPC ..................... *B23P 15/26* (2013.01)

(58) Field of Classification Search
CPC ............... B23P 15/26; Y10T 29/49353; Y10T 29/49364; Y10T 29/49936
See application file for complete search history.

(56) References Cited

U.S. PATENT DOCUMENTS

| | | | | |
|---|---|---|---|---|
| 6,853,555 B2* | 2/2005 | Fichera | ................. | H01L 23/473 165/80.4 |
| 7,131,200 B2* | 11/2006 | Lin | ..................... | B21D 53/085 228/262.21 |
| 7,245,494 B2* | 7/2007 | Cheng | ..................... | G06F 1/20 165/104.26 |
| 7,585,076 B2* | 9/2009 | Kinoshita | ................. | F28F 3/12 348/748 |
| 7,600,558 B2* | 10/2009 | Chen | ..................... | H01L 23/427 165/104.33 |
| 7,643,293 B2* | 1/2010 | Chu | ..................... | H01L 23/4093 165/104.33 |
| 7,698,815 B2* | 4/2010 | Garner | ................ | H01L 23/4093 29/890.032 |
| 7,849,598 B2* | 12/2010 | Hsu | ......................... | B21D 53/08 29/458 |
| 7,866,043 B2* | 1/2011 | Lin | ....................... | B21D 53/02 165/104.33 |

(Continued)

FOREIGN PATENT DOCUMENTS

TW    M486753 U    9/2014
TW    M497425 U    3/2015

*Primary Examiner* — Jason L Vaughan
(74) *Attorney, Agent, or Firm* — C. G. Mersereau; Nikolai & Mersereau, P.A.

(57) ABSTRACT

A heat dissipation unit manufacturing method is disclosed. The heat dissipation unit includes a heat pipe and a base seat. The base seat has a first side and a second side. The second side is formed with a channel and multiple perforations in communication with the first and second sides. The heat pipe has a heat absorption section and a conduction section. The conduction section extends from the heat absorption section in a direction to at least one end of the heat pipe distal from the heat absorption section. Several parts of the heat pipe corresponding to the perforations are received in the perforations and flush with the first side of the base seat. The heat dissipation unit manufacturing method improves the shortcoming of the conventional heat dissipation component that the coplanar precision between the heat pipe and the protruding platform of the base seat is hard to control.

5 Claims, 8 Drawing Sheets

(56) References Cited

U.S. PATENT DOCUMENTS

| | | | | |
|---|---|---|---|---|
| 7,891,414 B2* | 2/2011 | Cheng | ............... | F28D 15/0275 |
| | | | | 165/104.33 |
| 7,900,353 B2* | 3/2011 | Hsu | ............... | B23P 15/26 |
| | | | | 29/437 |
| 7,950,445 B2* | 5/2011 | Cheng | ............... | F28D 15/0275 |
| | | | | 165/104.33 |
| 8,136,245 B2* | 3/2012 | Lin | ............... | F28D 15/0275 |
| | | | | 29/890.032 |
| 8,161,644 B2* | 4/2012 | Lin | ............... | B21D 39/00 |
| | | | | 29/890.03 |
| 8,387,250 B2* | 3/2013 | Cheng | ............... | F28D 15/0275 |
| | | | | 29/726 |
| 9,381,599 B2* | 7/2016 | Yang | ............... | B23P 15/26 |
| 2007/0163770 A1* | 7/2007 | Liu | ............... | B21K 25/00 |
| | | | | 165/185 |
| 2007/0261244 A1* | 11/2007 | Cheng | ............... | B21D 39/00 |
| | | | | 29/890.03 |
| 2010/0051236 A1* | 3/2010 | Lin | ............... | B21D 53/06 |
| | | | | 165/104.21 |
| 2012/0312508 A1* | 12/2012 | Shen | ............... | F28D 15/0275 |
| | | | | 165/104.26 |

\* cited by examiner

HEAT DISSIPATION UNIT MANUFACTURING METHOD

BACKGROUND OF THE INVENTION

1. Field of the Invention

The present invention relates generally to a heat dissipation unit manufacturing method, and more particularly to a heat dissipation unit manufacturing method to enable a heat dissipation unit to have a better heat contact plane face.

2. Description of the Related Art

A current electronic apparatus has a central processing unit and other calculation chips inside. In operation, all of the central processing unit and the calculation chips will generate heat. Therefore, a heat dissipation component is needed to help in increasing the heat dissipation efficiency so as to more effectively dissipate the heat. The most often used heat dissipation components are such as heat pipes, vapor chambers, heat sinks and radiating fins. These components serve to speed the heat conduction or transfer the heat to a remote end to dissipate the heat or enlarge the heat dissipation area to enhance the heat dissipation performance. In general, the heat sink is in contact with the central processing unit to conduct the heat generated by the central processing unit. The heat sink can provide larger heat dissipation area. In order to transfer the heat at higher heat conduction speed, a heat pipe is combined with the heat sink. In addition, the section of the heat sink in contact with the central processing unit is formed with a perforation or a channel to directly expose the heat pipe to outer side into contact with the central processing unit to conduct the heat and transfer the heat to the heat sink with larger heat dissipation area to dissipate the heat.

Such heat dissipation component composed of the heat pipe and the heat sink is often employed. However, such heat dissipation component still has some shortcomings needing to be improved. That is, one side of the heat sink is formed with a channel for receiving the heat pipe and the heat pipe is fixed in the channel by means of passing the heat pipe through the heat sink or perpendicularly positioning the heat pipe on the heat sink. Under such circumstance, the heat pipe will partially protrude from the section of the heat sink that is in contact with the central processing unit. As a result, the flatness is poor to cause heat resistance. Conventionally, the protruding parts are processed and milled off. However, the parts of the heat pipe that protrude from the channel of the heat sink are not positioned on the same level. Moreover, the wall of the heat pipe often has non-uniform thickness. Therefore, when milling off the protruding parts of the heat pipe, it quite often takes place that the heat pipe is over-milled to damage the wall of the heat pipe. In this case, the heat pipe will lose its function.

SUMMARY OF THE INVENTION

It is therefore a primary object of the present invention to provide a heat dissipation unit manufacturing method to enable a heat dissipation unit to have a plane face in contact with a heat source with higher flatness precision.

To achieve the above and other objects, the heat dissipation unit of the present invention includes a heat pipe and a base seat. The base seat has a first side and a second side. The second side is formed with a channel and multiple perforations in communication with the first and second sides. The heat pipe has a heat absorption section and a conduction section. The conduction section extends from the heat absorption section in a direction to at least one end of the heat pipe distal from the heat absorption section. Several parts of the heat pipe corresponding to the perforations are received in the perforations and flush with the first side of the base seat.

To achieve the above and other objects, the heat dissipation unit manufacturing method includes the steps of:
providing a base seat and a heat pipe;
forming a channel and multiple perforations on an upper face of the base seat;
placing the heat pipe into the channel and mechanically processing the upper face of the base seat to force the heat pipe into the channel and the perforations; and
mechanically processing the lower face of the base seat to press the parts of the heat pipe that extrude from the perforations back into the perforations to be flush with the lower face of the base seat.

The heat dissipation unit manufacturing method of the present invention improve the shortcoming of the conventional heat dissipation unit composed of a heat dissipation base board and a heat pipe that when assembled, the coplanar precision between the heat pipe and the section of the heat dissipation base board in contact with the heat source can be hardly controlled.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
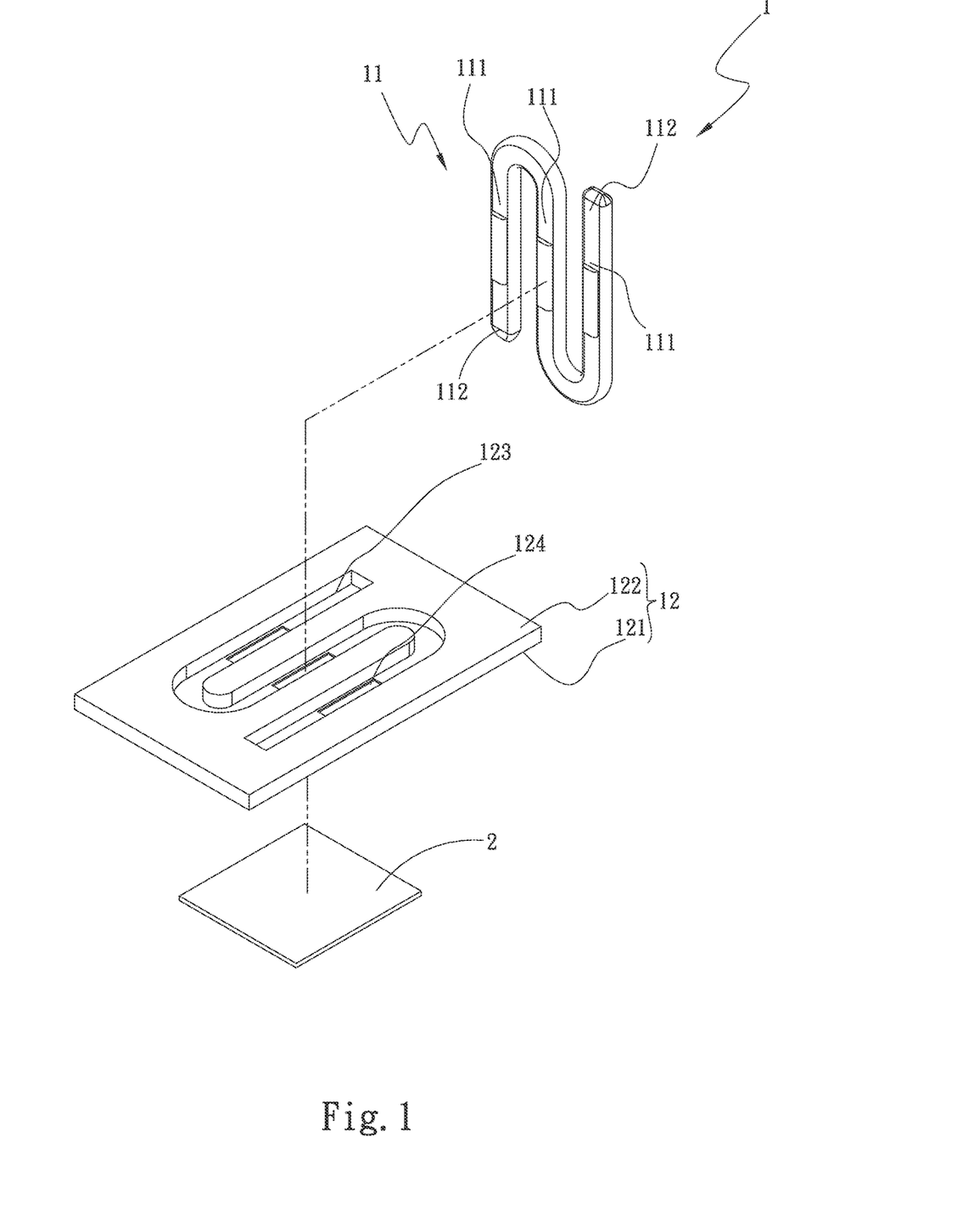
FIG. 1 is a perspective exploded view of a first embodiment of the heat dissipation unit of the present invention.
Figure 2:
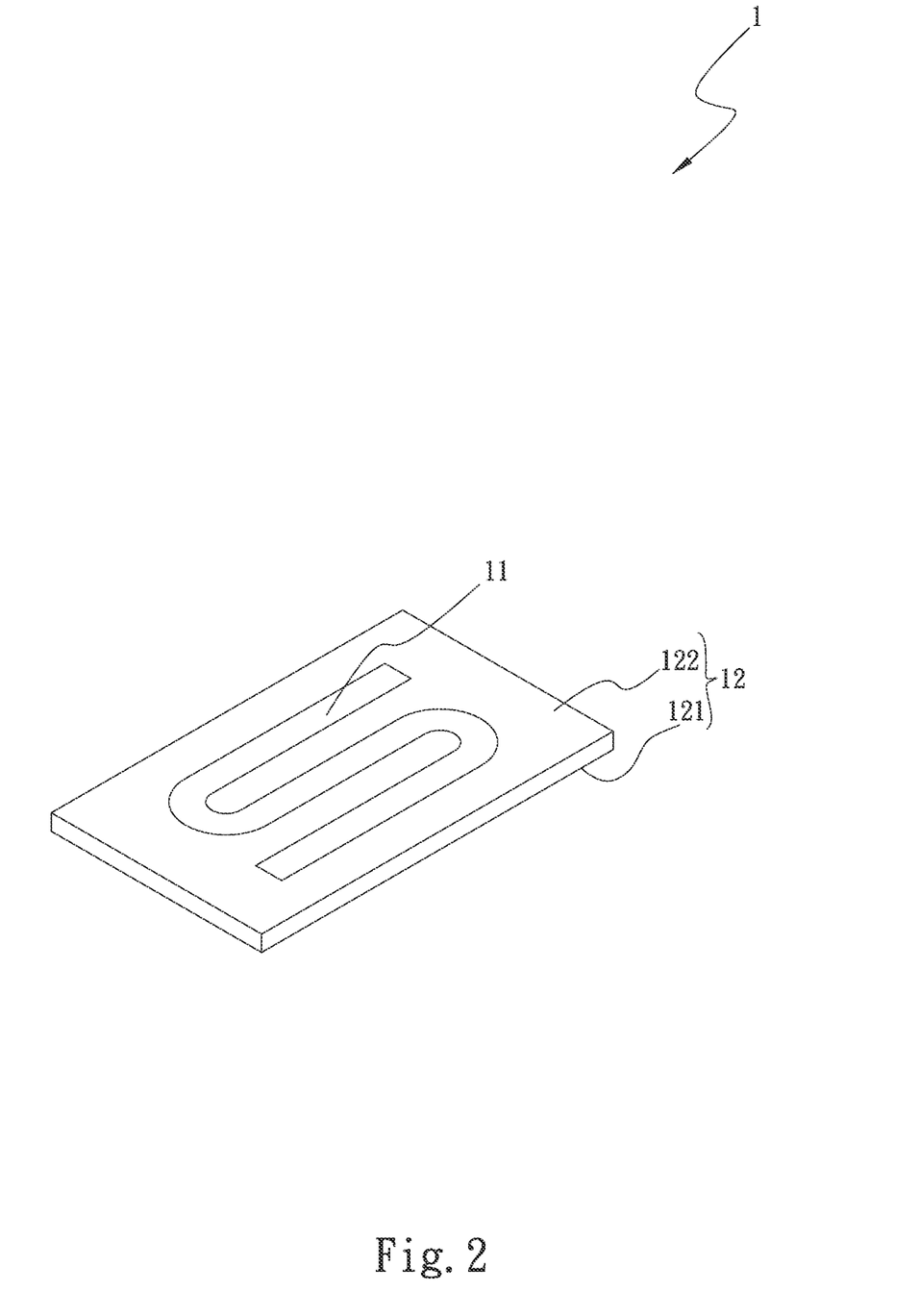
FIG. 2 is a perspective assembled view of the first embodiment of the heat dissipation unit of the present invention.

Please refer to FIGS. 1 and 2. FIG. 1 is a perspective exploded view of a first embodiment of the heat dissipation unit of the present invention. FIG. 2 is a perspective assembled view of the first embodiment of the heat dissipation unit of the present invention. As shown in the drawings, the heat dissipation unit 1 includes a heat pipe 11 and a base seat 12.

The heat pipe 11 has a heat absorption section 111 and a conduction section 112. The conduction section 112 extends from the heat absorption section 111 in a direction to at least one end of the heat pipe 11 distal from the heat absorption section 111. The heat pipe 11 is selected from a group consisting of flat-plate heat pipe, D-shaped heat pipe, circular heat pipe and an assembly thereof.

The base seat 12 has a first side 121 and a second side 122 oppositely formed on upper and lower faces of the base seat 12. The second side 122 is formed with a channel 123 and multiple perforations 124 in communication with the first and second sides 121, 122. The heat pipe 11 is received in the channel 123. In addition, several parts of the heat pipe 11 corresponding to the perforations 124 protrude into the perforations 124 and are received in the perforations 124 and flush with the first side 121 of the base seat 12.

The sections of the base seat 12 where the perforations 124 are formed are in direct contact with at least one heat source 2 to conduct heat.

Figure 3:
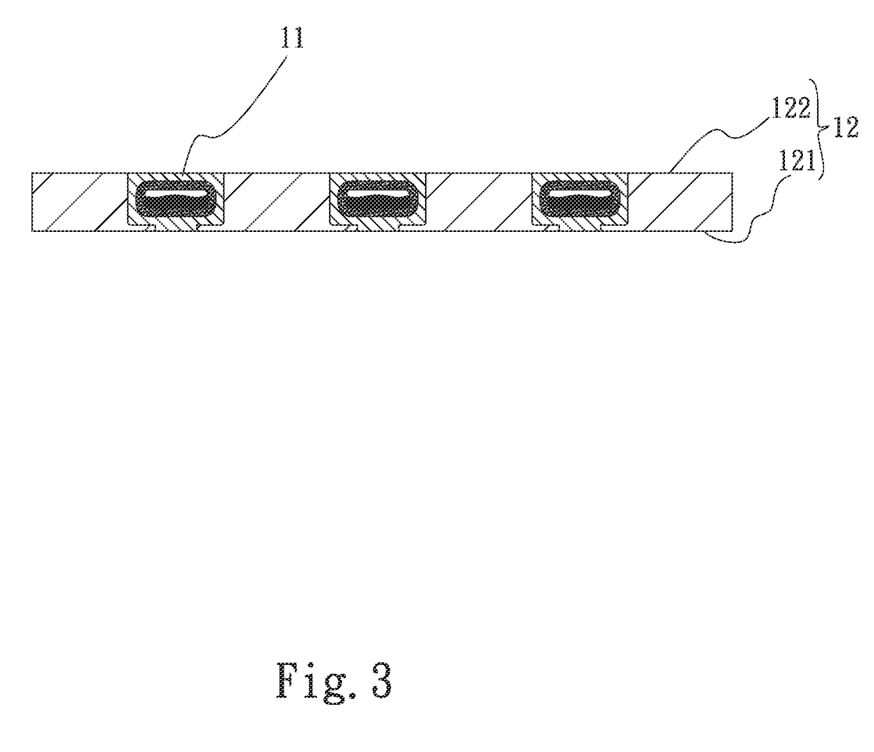
FIG. 3 is a sectional assembled view of the first embodiment of the heat dissipation unit of the present invention.

In this embodiment, as shown in FIG. 3, the protrusion sections of the heat pipe 11 are received in the perforations 124 of the base seat 12 and flush with the first side 121 of the base seat 12. The rest part of the heat pipe 11 is received in the channel 123 of the base seat 12 and flush with the second side 122 of the base seat 12.

Figure 4:
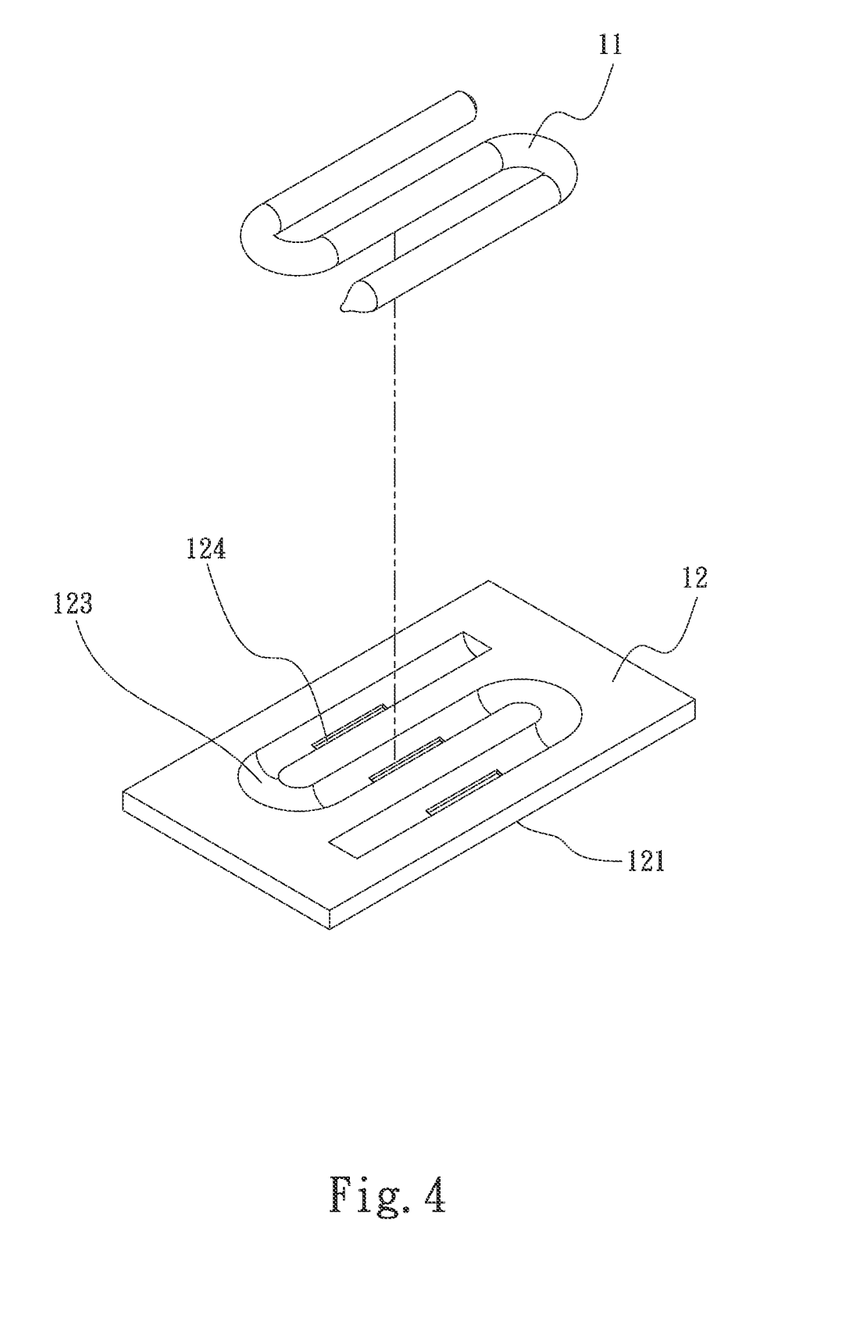
FIG. 4 is a perspective exploded view of a second embodiment of the heat dissipation unit of the present invention.
Figure 5:
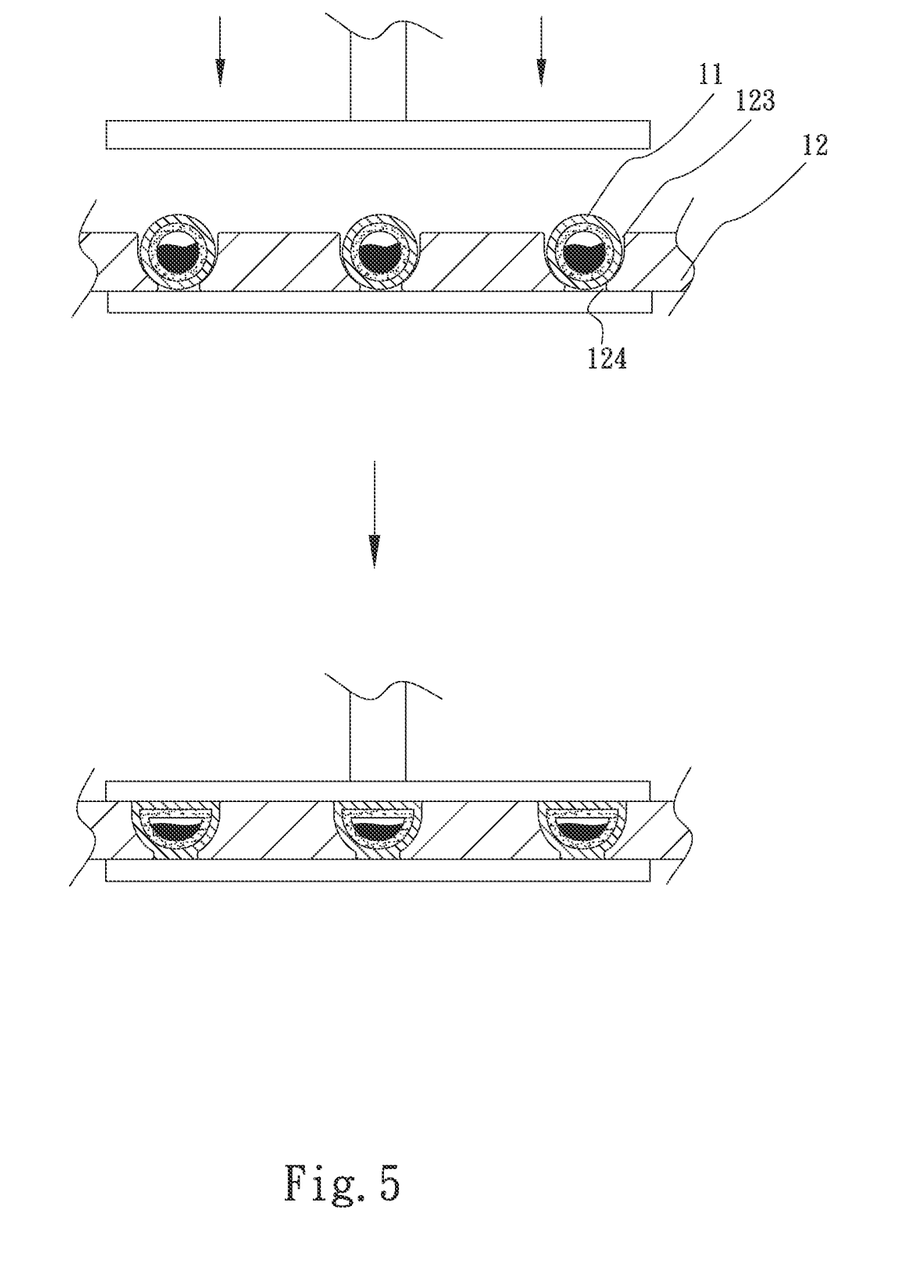
FIG. 5 is a sectional view showing the processing of the heat dissipation unit of the present invention.
Figure 6:
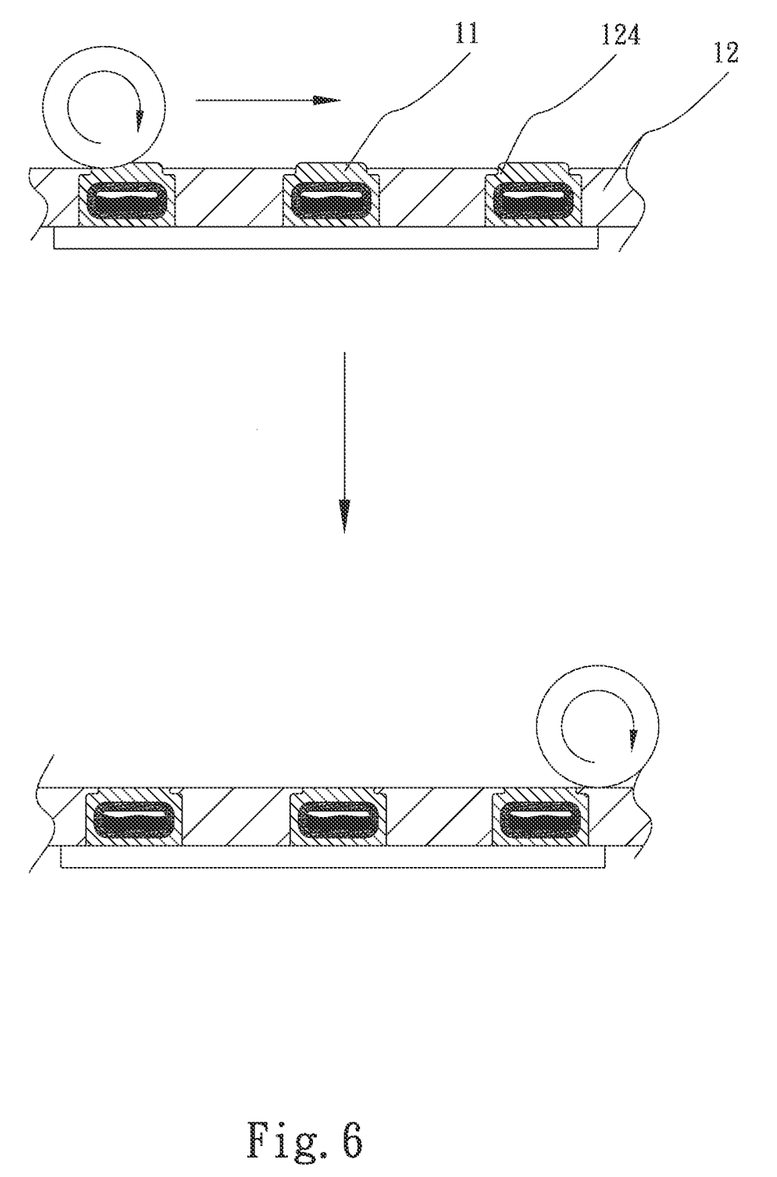
FIG. 6 is another sectional view showing the processing of the heat dissipation unit of the present invention.

Please now refer to FIG. 4, which is a perspective exploded view of a second embodiment of the heat dissipation unit of the present invention. In this embodiment, the heat pipe 11 is a circular heat pipe connected with the base seat 12. When the circular heat pipe 11 is placed into the channel 123 of the base seat 12 (the channel has an arched cross section in this embodiment), the heat pipe 11 partially protrudes from the channel 123 of the base seat 12. By means of mechanical processing (pressing and rolling), the section of the heat pipe 11 that protrudes from the channel 123 is forced into the channel 123 and filled into the perforations 124. Accordingly, the heat pipe 11 is shaped by the channel 123 and the perforations 124 and tightly bonded therewith. After mechanically processed and compressed, the heat pipe 11 may partially extrude from the perforations 124 and protrude from the first side 121 of the base seat 12. At this time, again by means of mechanical processing, the extruding part of the heat pipe 11 can be pressed back into the perforations 124 to be flush with the first side 121 of the base seat 12. Accordingly, the deformed two sides of the heat pipe 11 can be correspondingly flush with the first and second sides 121, 122 of the base seat 12. In this embodiment, a press processing is employed as the mechanical processing for illustration purposes (as shown in FIG. 5). However, the mechanical processing is not limited to the press processing. Alternatively, the mechanical processing can be rolling (as shown in FIG. 6).

Figure 7:
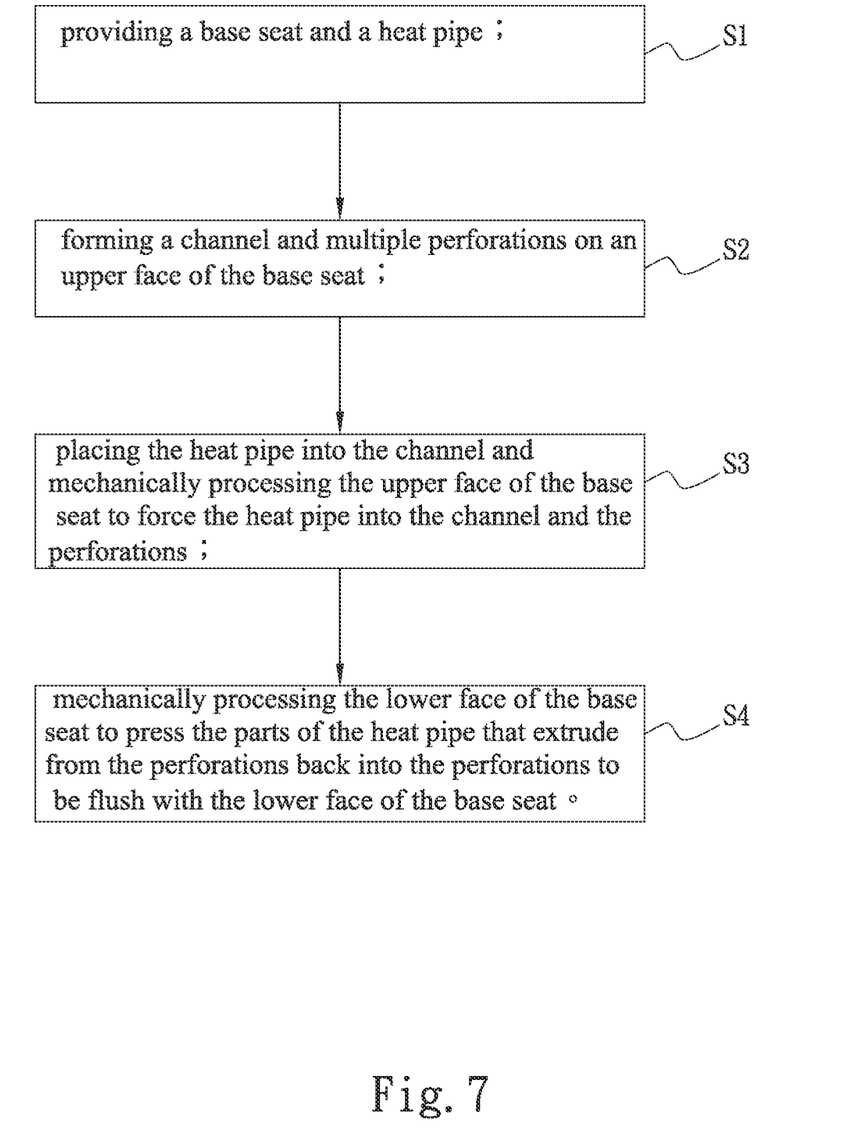
FIG. 7 is a flow chart of a first embodiment of the manufacturing method of the heat dissipation unit of the present invention.

Please now refer to FIG. 7, which is a flow chart of a first embodiment of the manufacturing method of the heat dissipation unit of the present invention. Also referring to FIGS. 1~6, the manufacturing method of the heat dissipation unit includes steps of:

S1. providing a base seat and a heat pipe, a base seat 12 and a heat pipe 11 being provided, the base seat 12 being made of a material selected from a group consisting of copper, aluminum and an alloy thereof, the heat pipe 11 being selected from a group consisting of flat-plate heat pipe, D-shaped heat pipe and circular heat pipe;

S2. forming a channel and multiple perforations on an upper face of the base seat, a channel 123 being formed on the upper face (the second side 122) of the base seat 12 by means of removing a part of the base seat 12, multiple perforations 124 being formed through the base seat 12 at the channel 123 near the center of the base seat 12 in communication with a lower face (the first side 121) of the base seat 12;

S3. placing the heat pipe into the channel and mechanically processing the upper face of the base seat to force the heat pipe into the channel and the perforations, the heat pipe 11 being correspondingly placed into the channel 123 of the base seat 12, by means of mechanical processing, a pressure being applied to the heat pipe to force the heat pipe into the channel and at the same time force several parts of the heat pipe corresponding to the perforations into the perforations, the mechanical processing being selected from a group consisting of pressing, rolling and forging, the mechanical processing being a one-time processing (pressing as shown in FIG. 5) or repeated multi-time processing (forging and rolling as shown in FIGS. 6 and 7); and S4. mechanically processing the lower face of the base seat to press the parts of the heat pipe that extrude from the perforations back into the perforations to be flush with the lower face of the base seat, after the parts of the heat pipe 11 corresponding to the perforations 124 of the base seat 12 are mechanically processed and forced into the perforations 124, the heat pipe 11 partially extruding from the perforations 124 and protruding from the lower face (the first side 121) of the base seat 12, again by means of mechanical processing, the parts of the heat pipe 11 that extrude from the perforations 124 of the base seat 12 being pressed and forced back into the perforations 124 to be flush with the lower face (the first side 121) of the base seat 12.

Figure 8:
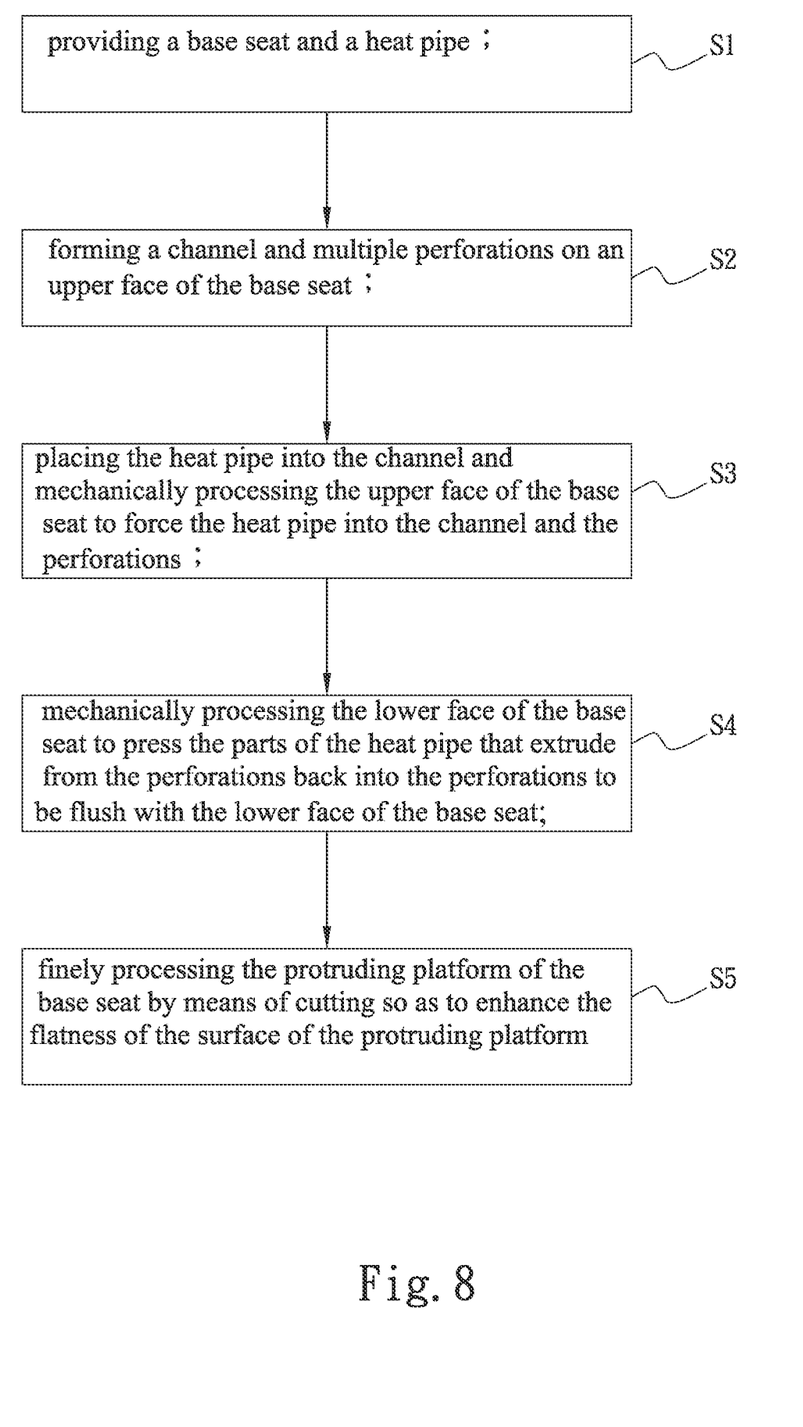
FIG. 8 is a flow chart of a second embodiment of the manufacturing method of the heat dissipation unit of the present invention.

Please now refer to FIG. 8, which is a flow chart of a second embodiment of the manufacturing method of the heat dissipation unit of the present invention. According to the second embodiment, the manufacturing method of the heat dissipation unit includes steps of:

S1. providing a base seat and a heat pipe;

S2. forming a channel and multiple perforations on an upper face of the base seat;

S3. placing the heat pipe into the channel and mechanically processing the upper face of the base seat to force the heat pipe into the channel and the perforations; and S4. mechanically processing the lower face of the base seat to press the parts of the heat pipe that extrude from the perforations back into the perforations to be flush with the lower face of the base seat. The second embodiment is partially identical to the first embodiment and thus will not be repeatedly described. The second embodiment is different from the first embodiment in that the second embodiment further includes a step of:

S5. finely processing the protruding platform of the base seat by means of cutting so as to enhance the flatness of the surface of the protruding platform. After mechanically processed, the surfaces of the base seat 12 and the heat pipe 11 are further processed by means of cutting process to enhance the precision of the surfaces. The cutting process is selected from a group consisting of milling, planing and grinding.

The manufacturing method of the present invention is able to greatly improve the shortcoming of the conventional heat dissipation unit that after the heat pipe and the base seat are connected, the precision of the heat dissipation unit is hard to control. Also, the manufacturing method of the present invention is able to improve the shortcoming of the conventional heat dissipation unit that the heat pipe can be hardly tightly connected with the base seat to cause heat resistance.

The present invention has been described with the above embodiments thereof and it is understood that many changes and modifications in the above embodiments can be carried out without departing from the scope and the spirit of the invention that is intended to be limited only by the appended claims.

What is claimed is:

1. A heat dissipation unit manufacturing method, comprising steps of:
   providing a base seat and a heat pipe;
   forming a channel and multiple perforations on an upper face of the base seat;
   placing the heat pipe into the channel and mechanically processing the upper face of the base seat to force the heat pipe into the channel and the perforations; and
   mechanically processing the lower face of the base seat to press the parts of the heat pipe that extrude from the perforations back into the perforations to be flush with the lower face of the base seat.

2. The heat dissipation unit manufacturing method as claimed in claim 1, wherein the multiple perforations are formed through the base seat at the channel near the center of the base seat.

3. The heat dissipation unit manufacturing method as claimed in claim 1, wherein the mechanical processing is selected from a group consisting of pressing, rolling and forging.

4. The heat dissipation unit manufacturing method as claimed in claim 1, further comprising a step of finely processing the protruding platform of the base seat by means of cutting so as to enhance the flatness of the surface of the protruding platform after the step of mechanically processing the lower face of the base seat to press the parts of the heat pipe that extrude from the perforations back into the perforations to be flush with the lower face of the base seat.

5. The heat dissipation unit manufacturing method as claimed in claim 1, wherein the heat pipe is selected from a group consisting of flat-plate heat pipe, D-shaped heat pipe and circular heat pipe.

* * * * *